(12) United States Patent
Yamamoto

(10) Patent No.: US 7,896,049 B2
(45) Date of Patent: Mar. 1, 2011

(54) SEMICONDUCTOR WAFER HOLDING METHOD, SEMICONDUCTOR WAFER HOLDING APPARATUS AND SEMICONDUCTOR WAFER HOLDING STRUCTURE

(75) Inventor: Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 686 days.

(21) Appl. No.: 11/882,665

(22) Filed: Aug. 3, 2007

(65) Prior Publication Data
US 2008/0038903 A1   Feb. 14, 2008

(30) Foreign Application Priority Data
Aug. 8, 2006   (JP) ............................. 2006-215959

(51) Int. Cl.
*B29C 65/52* (2006.01)
(52) U.S. Cl. ........................... 156/475; 156/446
(58) Field of Classification Search ............. 156/475, 156/446
See application file for complete search history.

(56) References Cited

U.S. PATENT DOCUMENTS

| | | | | | |
|---|---|---|---|---|---|
| 5,286,329 | A | * | 2/1994 | Iijima et al. | 156/297 |
| 5,930,654 | A | * | 7/1999 | Tohyama et al. | 438/464 |
| 6,007,654 | A | * | 12/1999 | McKenna | 156/156 |
| 2007/0238264 | A1 | * | 10/2007 | Sekiya | 438/460 |

FOREIGN PATENT DOCUMENTS

| | | | |
|---|---|---|---|
| JP | 2003-234392 | | 8/2003 |
| JP | 2005135931 | * | 5/2005 |

* cited by examiner

*Primary Examiner*—Khanh Nguyen
*Assistant Examiner*—John Blades
(74) *Attorney, Agent, or Firm*—Cheng Law Group, PLLC

(57) ABSTRACT

On a back face of a semiconductor wafer, an annular convex portion is formed at an outer periphery so as to surround a flat concave portion formed by back grinding. The back face of the semiconductor wafer is pressed against an adhesive surface of a supporting adhesive tape joined to a ring frame. Thus, the annular convex portion is joined to the adhesive tape. Further, the adhesive tape is deformed while being pressed from a side of its non-adhesive surface. As a result, the adhesive tape is pushed into and joined to the flat concave portion of the back face of the semiconductor wafer.

6 Claims, 15 Drawing Sheets

SEMICONDUCTOR WAFER HOLDING METHOD, SEMICONDUCTOR WAFER HOLDING APPARATUS AND SEMICONDUCTOR WAFER HOLDING STRUCTURE

BACKGROUND OF THE INVENTION (1) Field of the Invention

The present invention relates to a semiconductor wafer holding method and a semiconductor wafer holding structure each used for holding a semiconductor wafer in preprocessing in which the semiconductor wafer is transported or a workpiece is subjected to various processes. In particular, the present invention relates to a technique for holding a semiconductor wafer in such a manner that the semiconductor wafer is joined to a ring frame through a supporting adhesive tape.

(2) Description of the Related Art

For example, JP-A 2003-234392 discloses a technique for obtaining a semiconductor chip from a semiconductor wafer (hereinafter, simply referred to as a "wafer"). According to this technique, a wafer is joined to a supporting adhesive tape joined to a ring frame such that the ring frame holds the wafer; thus, a semiconductor wafer holding structure is prepared. Then, the semiconductor wafer holding structure is subjected to a dicing process, so that the wafer held and supported by the ring frame is divided into a plurality of semiconductor chips.

In recent years, however, a wafer has been made thinner in response to needs for size reduction and high-density package as to an electronic device. In order to fill the needs, the recent wafer has a thickness of several tens of micrometers. Such a wafer having a considerably small thickness is susceptible to damage such as cracking or chipping due to bending or warping and, therefore, requires careful handling. For ease of the handling, a center of a back face of the wafer is ground to form an annular convex portion at an outer periphery of the back face. Thus, the wafer is allowed to have rigidity during a period from grinding of the back face to holding of the wafer by a ring frame.

The formation of the annular convex portion is effective in handling of the wafer until the wafer is held by the ring frame. If the back face of wafer is held by the ring frame through an adhesive tape prior to performance of a dicing process, the annular convex portion comes into close contact with the adhesive tape, but a flat concave portion corresponding to the ground center does not come into close contact with the adhesive tape. Consequently, there is a problem that the flat concave portion becomes susceptible to damage when the wafer is divided into chips in the dicing process.

SUMMARY OF THE INVENTION

An object of the present invention is to provide a semiconductor wafer holding method, a semiconductor wafer holding apparatus and a semiconductor wafer holding structure, each having an advantage that a wafer, which has been made thin, can be joined to and held by a ring frame through a supporting adhesive tape with good accuracy, without being damaged.

In order to accomplish the aforementioned object, the present invention adopts the following configuration:

A method for joining a semiconductor wafer to a ring frame through a supporting adhesive tape such that the ring frame holds the semiconductor wafer, the method comprising the steps of: preparing a semiconductor wafer having a back face on which an annular convex portion is formed at an outer periphery so as to surround a flat concave portion formed by back grinding; and pressing the back face of the semiconductor wafer against an adhesive surface of an adhesive tape joined to a ring frame, joining the adhesive tape to the annular convex portion, pressing the adhesive tape from a side of a non-adhesive surface so as to deform the adhesive tape, and pushing and joining the adhesive tape into and to the flat concave portion on the back face of the semiconductor wafer.

With the method according to the present invention, even when the semiconductor wafer is made thin, the annular convex portion left along the outer periphery of the back face of the semiconductor wafer enhances rigidity of the semiconductor wafer. In addition, the supporting adhesive tape is joined to the entire back face of the semiconductor wafer so as to intrude into the flat concave portion. Thus, the semiconductor wafer can be held by the ring frame with rigidity thereof further enhanced.

In the joining step, preferably, a joining member moves spirally from a center of the flat concave portion in an outward direction while revolving, presses the adhesive tape, and pushes and joins the adhesive tape into and to the flat concave portion.

With this configuration, the adhesive tape is joined to the flat concave portion from the center in the outward direction while being stretched. Thus, the adhesive tape can be smoothly joined without wavy wrinkles. As a result, it is possible to improve joining accuracy.

For example, the joining member is formed into an elastically deformable brush shape. Thus, the adhesive tape can be entirely and readily pushed and stretched. Accordingly, the adhesive tape can be joined to outer peripheral corners of the flat concave portions with certainty.

In the joining step, preferably, a pressing member presses the ring frame when the joining member moves while revolving.

Preferably, the pressing member includes a plurality of rollers pressing the ring frame at a plurality of points and rolling on the ring frame in synchronization with the revolving and moving of the joining member.

With this configuration, the adhesive tape can be joined to the flat concave portion in a state that the ring frame is prevented from floating and vibrating.

In the joining step, preferably, a pressing member which is internally fitted to the flat concave portion is pushed into the flat concave portion such that the adhesive tape is pushed into and joined to the flat concave portion.

With this configuration, only when the pressing member is pushed into the flat concave portion once, the adhesive tape can be pushed into and joined to the entire flat concave portion at a single stroke. This is effective at reduction in processing time.

In the joining step, preferably, the adhesive tape is pushed into and joined to the flat concave portion while the pressing member is heated such that the adhesive tape is heated.

With this configuration, the adhesive tape comes into contact with the pressing member, thereby being softened appropriately. As a result, the adhesive tape is readily deformed, and is readily pushed into the flat concave portion. Thus, the adhesive tape can be appropriately joined to the outer peripheral corners of the flat concave portion.

In the joining step, preferably, the adhesive tape is joined to the flat concave portion under reduced pressure.

With this configuration, the supporting adhesive tape can be joined to the entire flat concave portion without a disadvantage that air bubbles get in an interface between the supporting adhesive tape and the flat concave portion.

In the joining step, preferably, the ring frame is suction held.

With this configuration, the ring frame can be prevented from being rotated together with the joining member and can be prevented from being moved slightly.

In order to accomplish the aforementioned object, the present invention also adopts the following configuration:

An apparatus for joining a semiconductor wafer to a ring frame through a supporting adhesive tape such that the ring frame holds the semiconductor wafer, the apparatus comprising: a wafer support bench supporting a flat back face of a semiconductor wafer on which an annular convex portion is formed along an outer periphery so as to surround a background area and a flat concave portion is formed at an inner-diameter side of the annular convex portion; a ring frame support bench holding a ring frame having an adhesive tape joined thereto; and a joining mechanism joining the adhesive tape to the flat concave portion of the semiconductor wafer while pressing a non-adhesive surface of the adhesive tape against the flat concave portion of the semiconductor wafer.

With this configuration, it is possible to suitably realize the aforementioned method.

In order to accomplish the aforementioned object, the present invention also adopts the following configuration:

A semiconductor wafer holding structure comprising: a semiconductor wafer having a back face on which an annular convex portion is formed at an outer periphery so as to surround a flat concave portion formed by back grinding; and a ring frame having a supporting adhesive tape joined thereto, the supporting adhesive tape being joined to the flat concave portion.

With this configuration, the flat concave portion of the semiconductor wafer has a small thickness and, therefore, decreases in strength. However, the annular convex portion left along the outer periphery of the back face of the semiconductor wafer functions as a reinforcing rib to enhance rigidity of the semiconductor wafer as a whole. Unlike a conventional wafer holding structure in which a thin wafer having an even thickness is joined to and held by a ring frame, therefore, the wafer holding structure in which the supporting adhesive tape joined to the ring frame is pushed into and joined to the concave flat portion can enhance the rigidity of the semiconductor wafer. Accordingly, the semiconductor wafer holding structure can hold a semiconductor wafer having a considerably thin flat concave portion (back-ground area) without a risk of damage.

In addition, subsequent processing is performed in a state that the adhesive tape is joined to the semiconductor wafer having the annular convex portion for reinforcement left thereon. Therefore, it is possible to omit a step of removing by grinding the annular convex portion from the back face of the semiconductor wafer. This is effective at improvement in workability as to a semiconductor chip manufacturing process.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Hereinafter, description will be given of one embodiment of the present invention with reference to the drawings.

Figure 13:
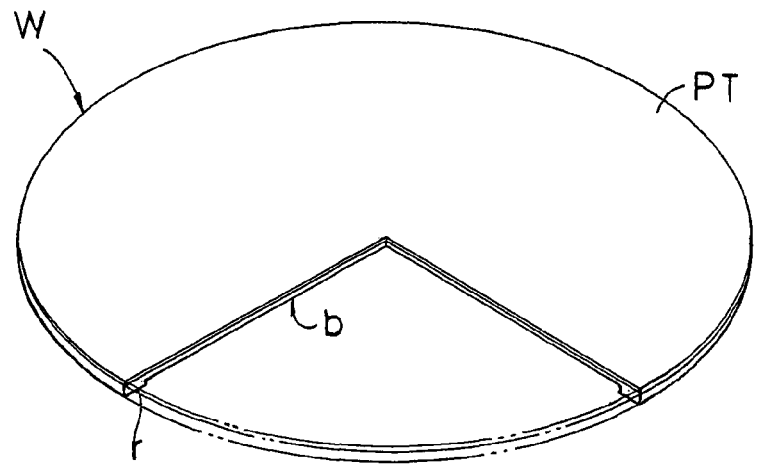
FIG. 13 is a partially-cutout perspective view illustrating a front face of a semiconductor wafer.
Figure 14:
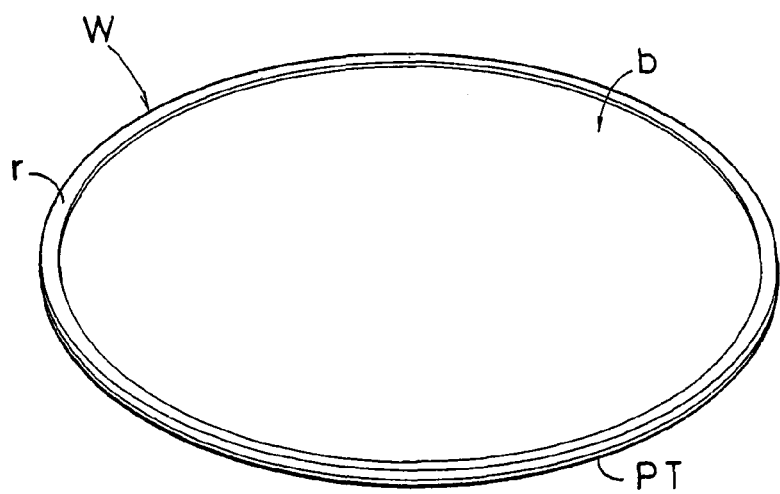
FIG. 14 is a perspective view illustrating a back face of the semiconductor wafer.
Figure 15:
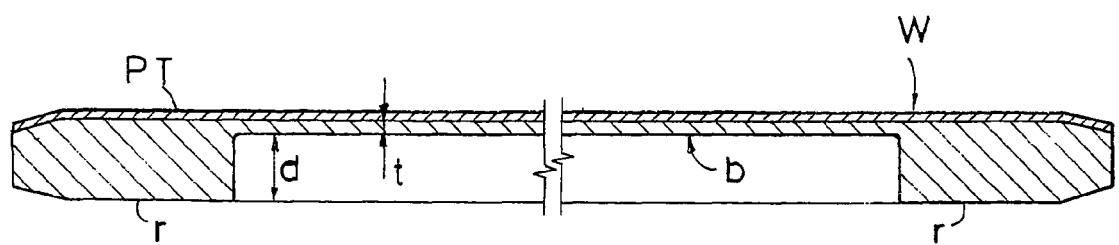
FIG. 15 is a vertical sectional view illustrating the semiconductor wafer.

With reference to FIGS. 13 to 15, first, description will be given of a structure of a semiconductor wafer according to the present invention.

FIG. 13 is a partially-cutout perspective view illustrating a front face of a wafer W which is a subject to be processed in the present invention. FIG. 14 is a perspective view illustrating a back face of the wafer W. FIG. 15 is a vertical sectional view illustrating the wafer W.

The wafer W is subjected to a back grinding process in a state that a protective tape PT is joined to the front face so as to protect a pattern formed on the front face. The back face of the wafer W is ground such that an outer periphery becomes higher than a ground area by about 2 mm in a radial direction. Thus, a flat concave portion b is formed on the back face, and an annular convex portion r is formed along the outer periphery of the back face. Herein, the flat concave portion b has a depth d of several hundreds of micrometers and a thickness t of several tens of micrometers, for example. Accordingly, the annular convex portion r formed at the outer periphery of the back face functions as an annular rib for enhancing rigidity of the wafer W. Hence, the annular convex portion r prevents the wafer W from being bent in handling and another processing.

Figure 16:
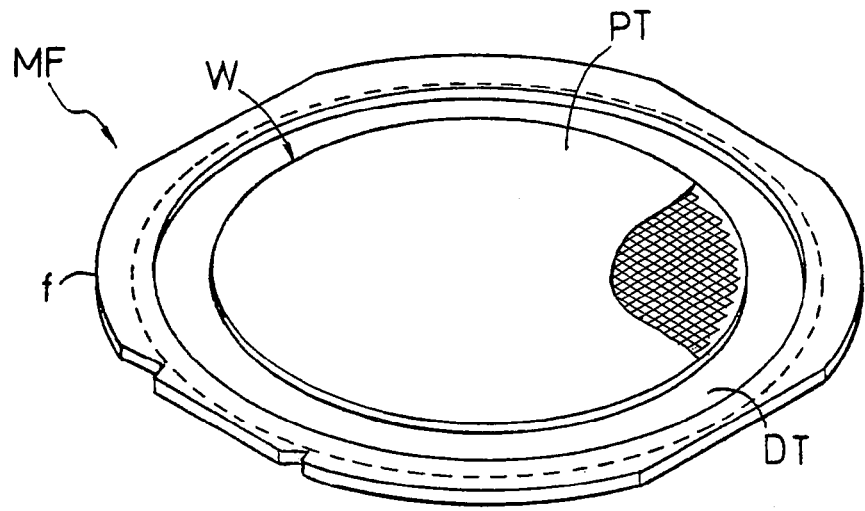
FIG. 16 is a perspective view illustrating a front side of a semiconductor wafer holding structure.
Figure 17:
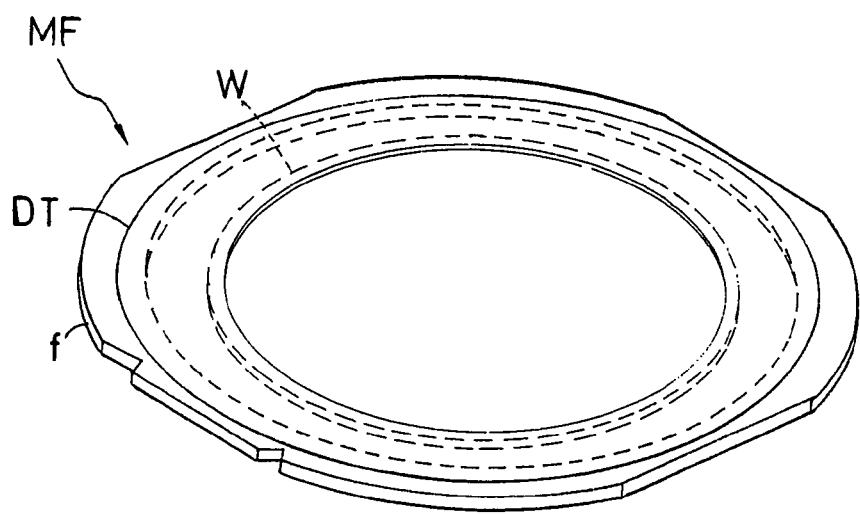
FIG. 17 is a perspective view illustrating a rear side of the semiconductor wafer holding structure.
Figure 18:
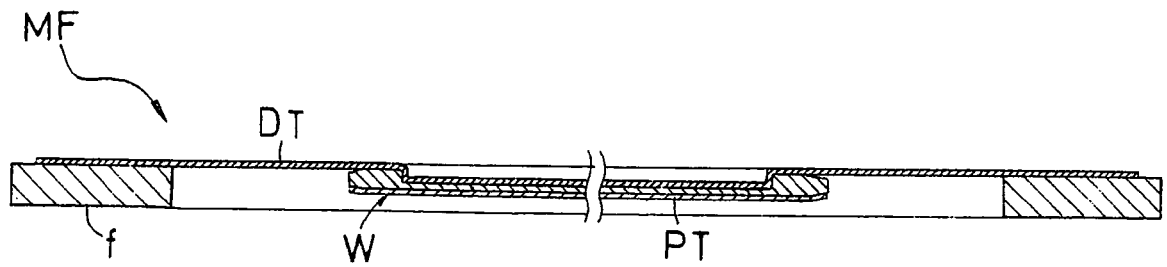
FIG. 18 is a vertical sectional view illustrating the semiconductor wafer holding structure.
Figure 19:
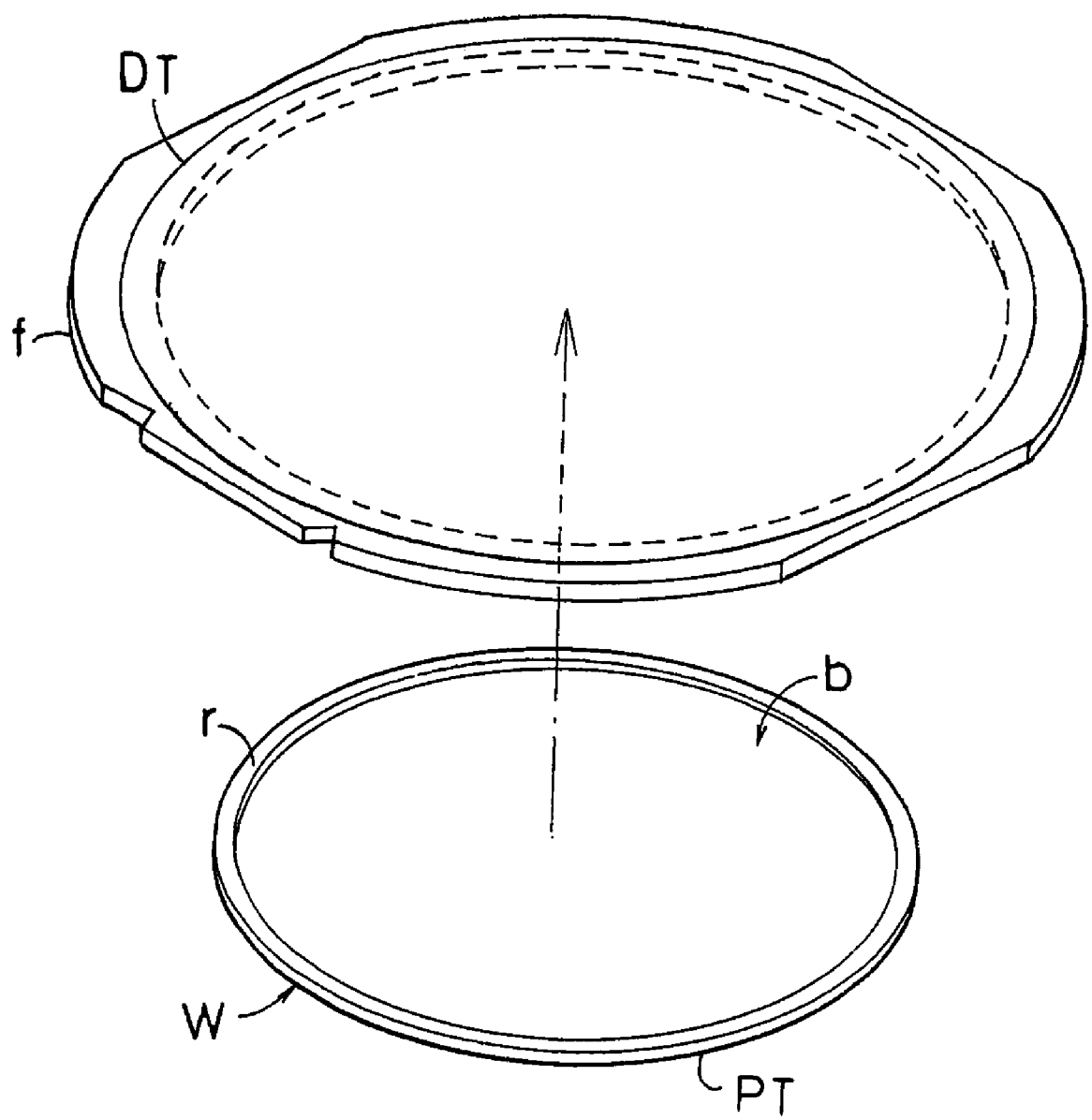
FIG. 19 is an exploded perspective view illustrating the semiconductor wafer holding structure.

As illustrated in FIG. 18, an adhesive surface of a supporting adhesive tape (dicing tape) DT joined to a ring frame f in a stretched manner is joined to the back face, on which the annular convex portion r is formed, of the wafer W such that the ring frame f holds the wafer W. Thus, a wafer holding structure (mount frame) MF illustrated in FIGS. 16 to 18 is prepared.

Hereinafter, description will be given of an apparatus and a procedure for joining the wafer W to the ring frame f through the adhesive tape DT in the state that the flat concave portion b is formed by grinding on the back face of the wafer W, on the basis of two embodiments.

FIGS. 1 to 6 illustrate a wafer joining apparatus and a wafer joining procedure according to a first embodiment.

Figure 1:
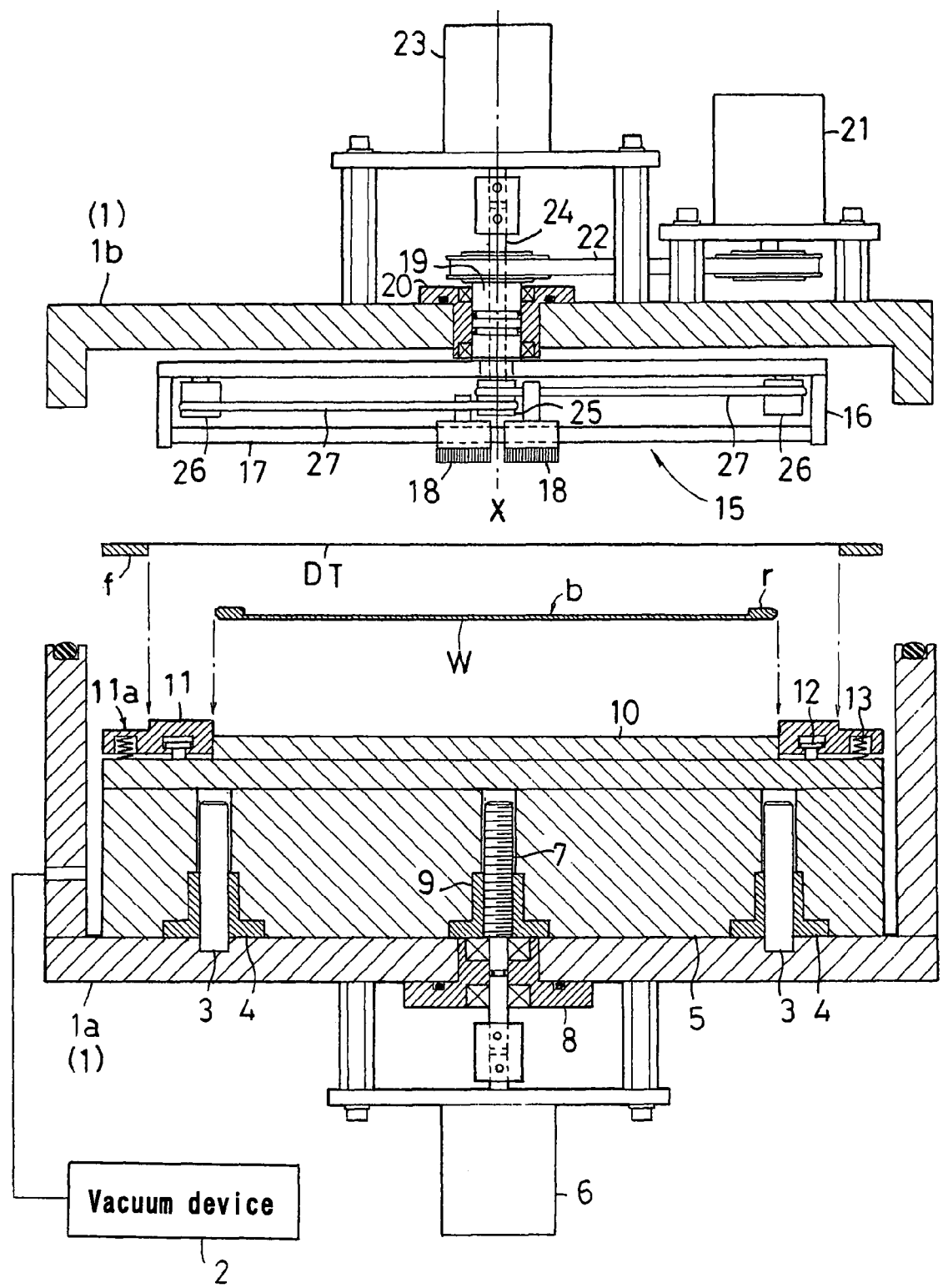
FIG. 1 is a vertical sectional view illustrating an operation of transporting a semiconductor wafer and a ring frame into a semiconductor wafer mount apparatus according to a first embodiment of the present invention.

As illustrated in FIG. 1, the wafer joining apparatus includes a chamber 1. The chamber 1 includes a deep column-shaped chamber main body 1a, and a shallow disc-shaped lid case 1b attached to and detached from an upper end of the chamber main body 1a. The chamber main body 1a is communicated with and connected to a vacuum device 2.

A plurality of guide shafts 3 are fixedly provided upright on a bottom of the chamber main body 1a. The guide shafts 3 are equipped with a movable table 5 which is guided through slide bushes 4 to move vertically in a horizontal posture. At a center of the bottom of the chamber main body 1a, a screw shaft 7 driven by a motor 6 is provided upright through a bearing bracket 8. The screw shaft 7 is screwed and inserted into a female screw bush 9 which is fixedly attached to a center of the movable table 5. With this configuration, when the screw shaft 7 is rotated in a forward/backward direction, the movable table 5 moves vertically.

A disc-shaped wafer support bench 10 having an outer diameter corresponding to an outer diameter of the wafer W is fixedly coupled to a top of the movable table 5. Further, an annular ring frame support bench 11 outwardly fitted to the wafer support bench 10 is disposed on the top of the movable table 5 so as to move vertically. The ring frame support bench 11 is supported by a plurality of headed pins 12 each fixedly provided on the top of the movable table 5 in a circumferential direction with a vertical clearance in a small range. This configuration restricts a range where the ring frame support bench 11 moves vertically. The ring frame support bench 11 is lifted up and biased at an upper limit position by a plurality of springs 13 interposed in the circumferential direction. On a top of the ring frame support bench 11, a recessed stage 11a is formed for positioning the ring frame f fitted thereto. The recessed stage 11a has a depth equal to or slightly shallower than a thickness of the ring frame f.

The lid case 1b is driven by a lift mechanism (not illustrated) to move vertically. A joining mechanism 15 is provided inside the lid case 1b. The joining mechanism 15 includes a rotation frame 16, a guide shaft 17 and a pair of joining members 18. The rotation frame 16 is rotatable about a vertical axis center X which is concentric with a center of the wafer support bench 10. The guide shaft 17 is horizontally provided on a lower side of the rotation frame 16. The pair of joining members 18 are supported by the guide shaft 17 so as to move horizontally while being guided by the guide shaft 17. The joining member 18 is formed into a brush shape which is elastically deformed in moderation.

A cylinder-shaped rotation driving shaft 19 penetrates through a center of the lid case 1b through a bearing bracket, 20 so as to rotate about the vertical axis center X. The rotation frame 16 is coupled to a lower end of the rotation driving shaft 19. A belt 22 is wound between an upper side of the rotation driving shaft 19 and a motor 21 such that the rotation driving shaft 19 is interlocked with the motor 21. Herein, the motor 21 is provided on one side of a top of the lid case 1b. With this configuration, when the motor 21 is actuated, the rotation frame 16 is driven to rotate about the vertical axis center X.

An internal shaft 24 is inserted into a center of the rotation driving shaft 19, and is driven in the forward/backward direction by a motor 23 disposed above the center of the lid case 1b. Belts 27 are wound between a driving pulley 25 and a pair of idling pulleys 26, respectively, in a stretched manner. The driving pulley 25 is provided on a lower side of the internal shaft 24 and extends vertically. The pair of idling pulleys 26 are pivotally supported near two ends of the rotation frame 16. That is, the pair of joining members 18 are coupled to positions where the belts 27 rotate backwardly. With this configuration, when the internal shaft 24 rotates in a certain direction, the joining members 18 coupled to the belts 27 move so as to be spaced away from each other or so as to approach each other.

The wafer joining apparatus is configured as described above. Next, description will be given of operations performed by the wafer joining apparatus.

(1) As illustrated in FIG. 1, the chamber 1 is open in such a manner that the lid case 1b is retracted upward. A wafer W is transported into the wafer joining apparatus in a state that a back face thereof, on which a flat concave portion b is formed by back grinding, is directed upward. Herein, a ring frame f is also transported into the wafer joining apparatus in a state that an adhesive surface of a supporting adhesive tape DT joined thereto is directed downward. Also herein, the movable table 5 is situated at its lower limit position, and the joining members 18 of the joining mechanism 15 are situated at initial positions, that is, are close to each other.

(2) The wafer W transported into the wafer joining apparatus is placed on the wafer support bench 10, and then is positioned by an inner periphery of the ring frame support bench 11. The ring frame f transported into the wafer joining apparatus is positioned by and placed on the recessed stage 11a of the ring frame support bench 11.

Figure 2:
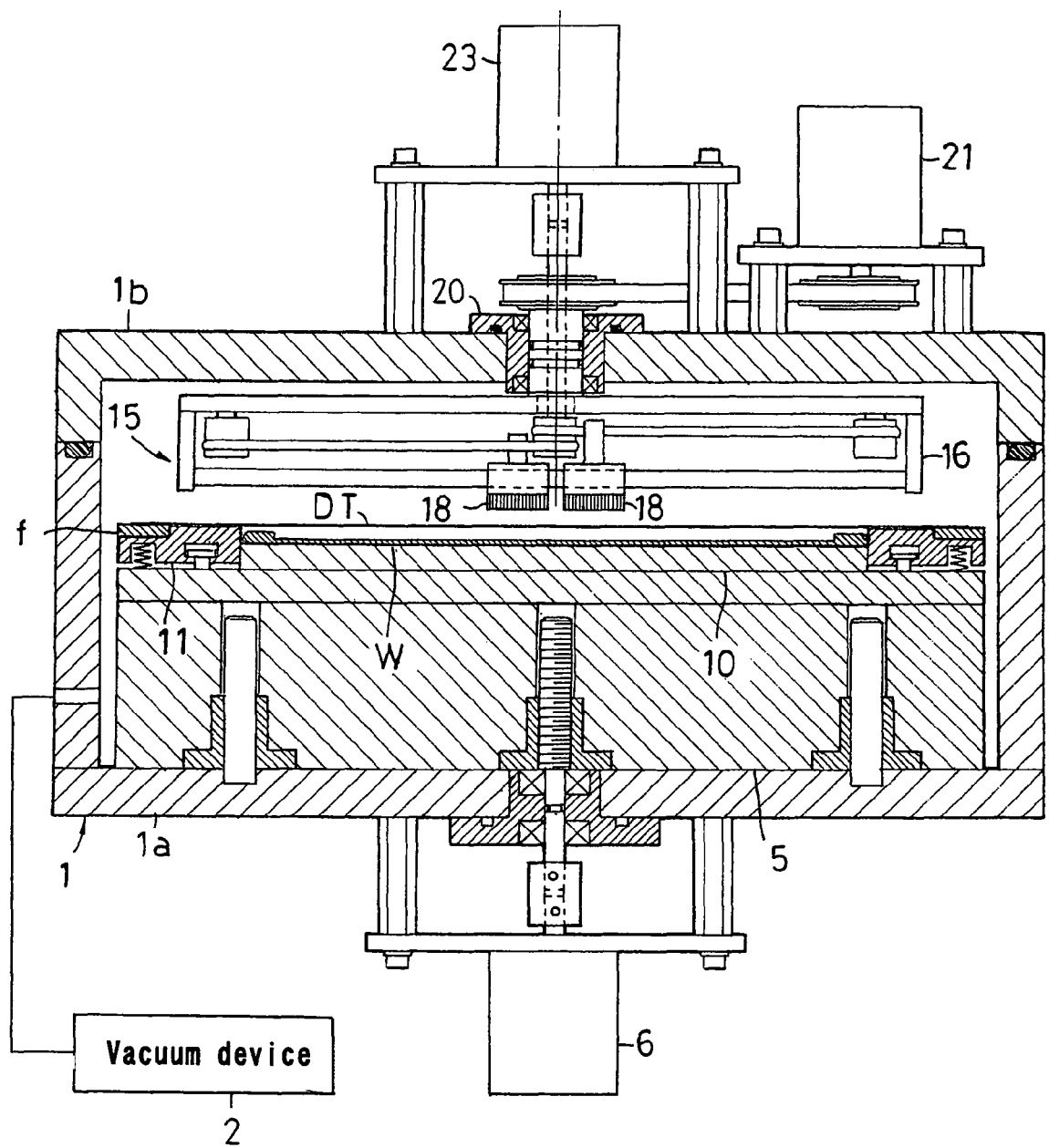
FIGS. 2 to 4 are vertical sectional views each illustrating an operation of joining the semiconductor wafer to the ring frame in the first embodiment.

(3) As illustrated in FIG. 2, when both the wafer W and the ring frame f are transported into the wafer joining apparatus, the lid case 1b moves downward. Thus, the lid case 1b is hermetically attached to the upper end of the chamber main body 1a. Thereafter, the vacuum device 2 sucks air in the chamber 1, so that a pressure in the chamber 1 is reduced. Herein, the joining member 18 is situated at a height where the joining member 18 does not come into contact with the adhesive tape DT.

Figure 3:
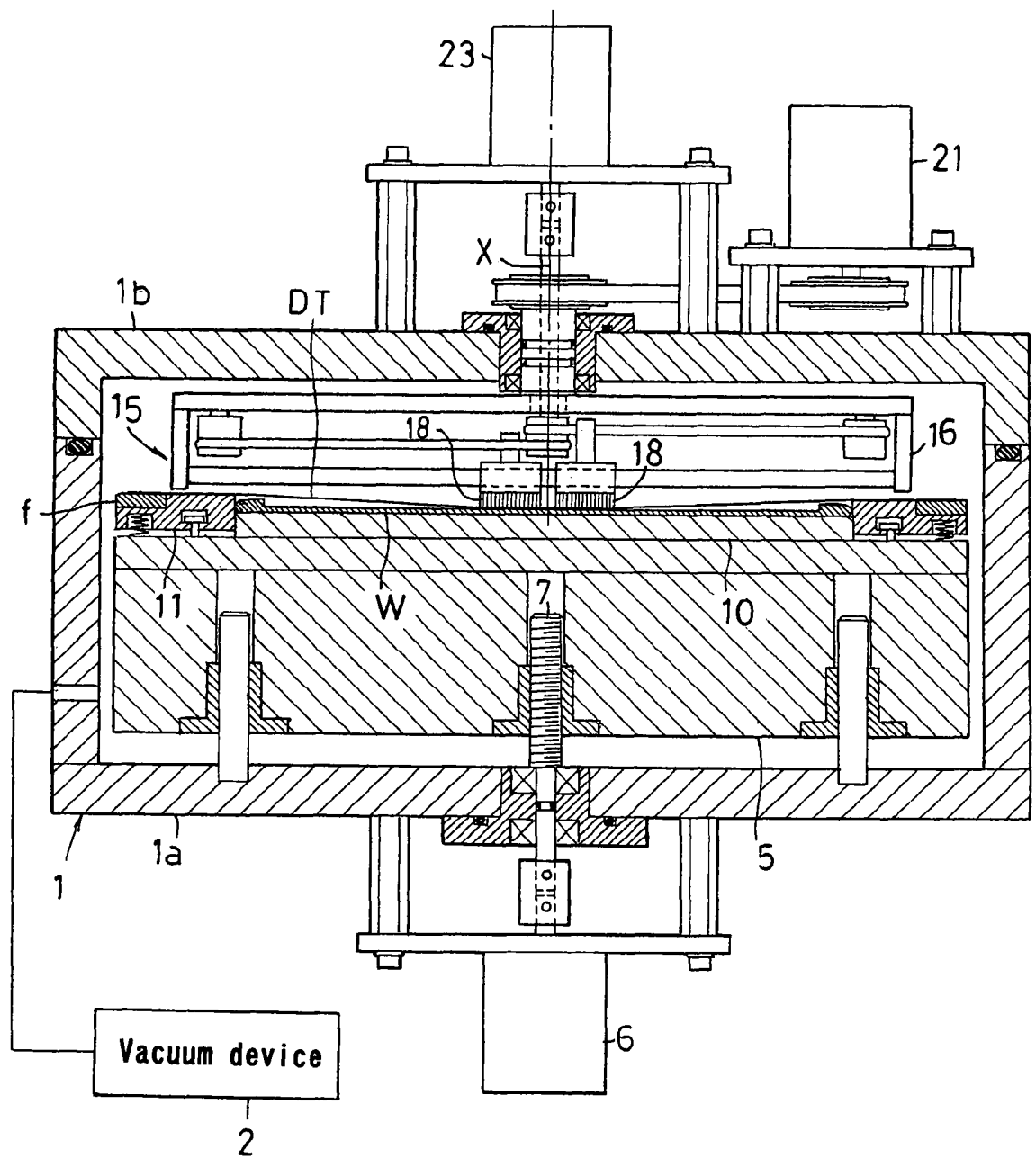

(4) As illustrated in FIG. 3, when the internal pressure in the chamber 1 is reduced to a predetermined pressure which is an almost vacuum state, the movable table 5 moves upward to a predetermined position. Herein, the joining member 18 situated at the initial position near the vertical axis center X is pressed against a center of an upper surface (non-adhesive surface) of the adhesive tape DT. Thus, the center of the adhesive tape DT pressed by the joining member 18 is deformed downward, and then is joined to an almost center of the flat concave portion b of the wafer W.

(5) Next, when the motor 21 is actuated, the rotation frame 16 rotates in a predetermined direction. Simultaneously, when the motor 23 is actuated, the joining members 18 move so as to be spaced away from each other. Thus, each joining member 18 moves spirally from the center in the outward direction while revolving, and joins the adhesive tape DT to the flat concave portion b and an annular convex portion r on the back face of the wafer W.

Figure 4:
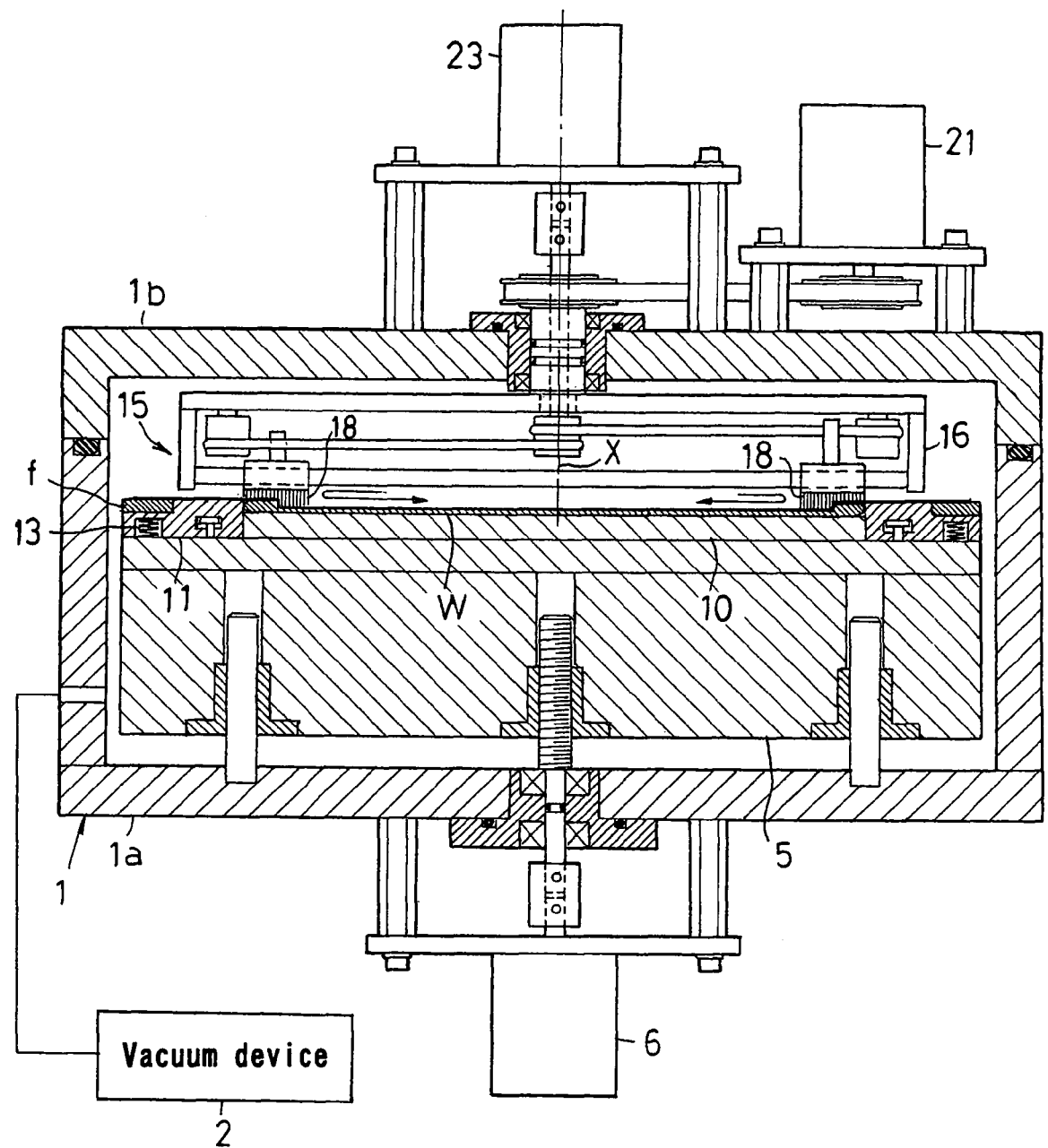

As illustrated in FIG. 4, when detection means appropriately detects a fact that the joining member 18 reaches an outer end, only the motor 23 is actuated in a reverse direction while the joining member 18 keeps rotating. More specifically, the joining members 18 move so as to approach each other. Each joining member 18 moves spirally toward the center in an inward direction while revolving, and joins the adhesive tape DT to the flat concave portion b and the annular convex portion r on the back face of the wafer W. Thereafter, when the joining members 18 return to the initial positions, the motors 21 and 23 stop.

In this joining operation, as the joining member 18 approaches the outer end, a downward pressing force of the joining member 18 to be applied to the ring frame f becomes larger. Thus, the ring frame support bench 11 is pushed downward against the spring 13, and the top of the ring frame support bench 11 becomes flush with the top of the annular convex portion r, so that the adhesive tape DT is joined to the annular convex portion r with certainty.

Figure 6:
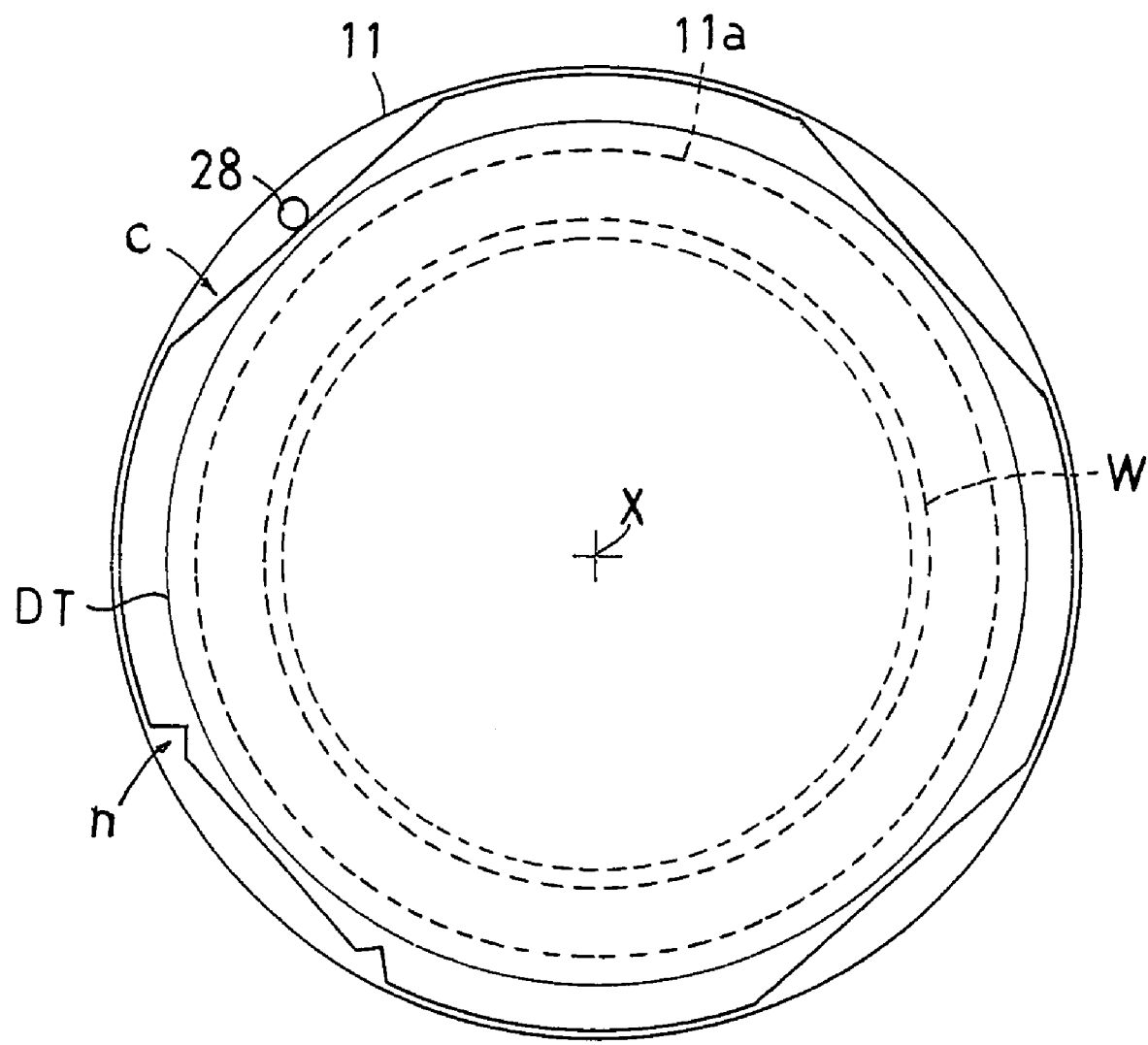
FIG. 6 is a plan view illustrating a structure for preventing the ring frame from rotating together with a joining member.

As illustrated in FIG. 6, herein, a locking pin 28 is provided upright on the recessed stage 11a of the ring frame support bench 11 so as to be lower than the thickness of the ring frame f, and is brought into contact with a flat cut portion c or a notch n formed at the outer periphery of the ring frame f. With this configuration, the ring frame f is prevented from being rotated together with the joining member 18.

Figure 5:
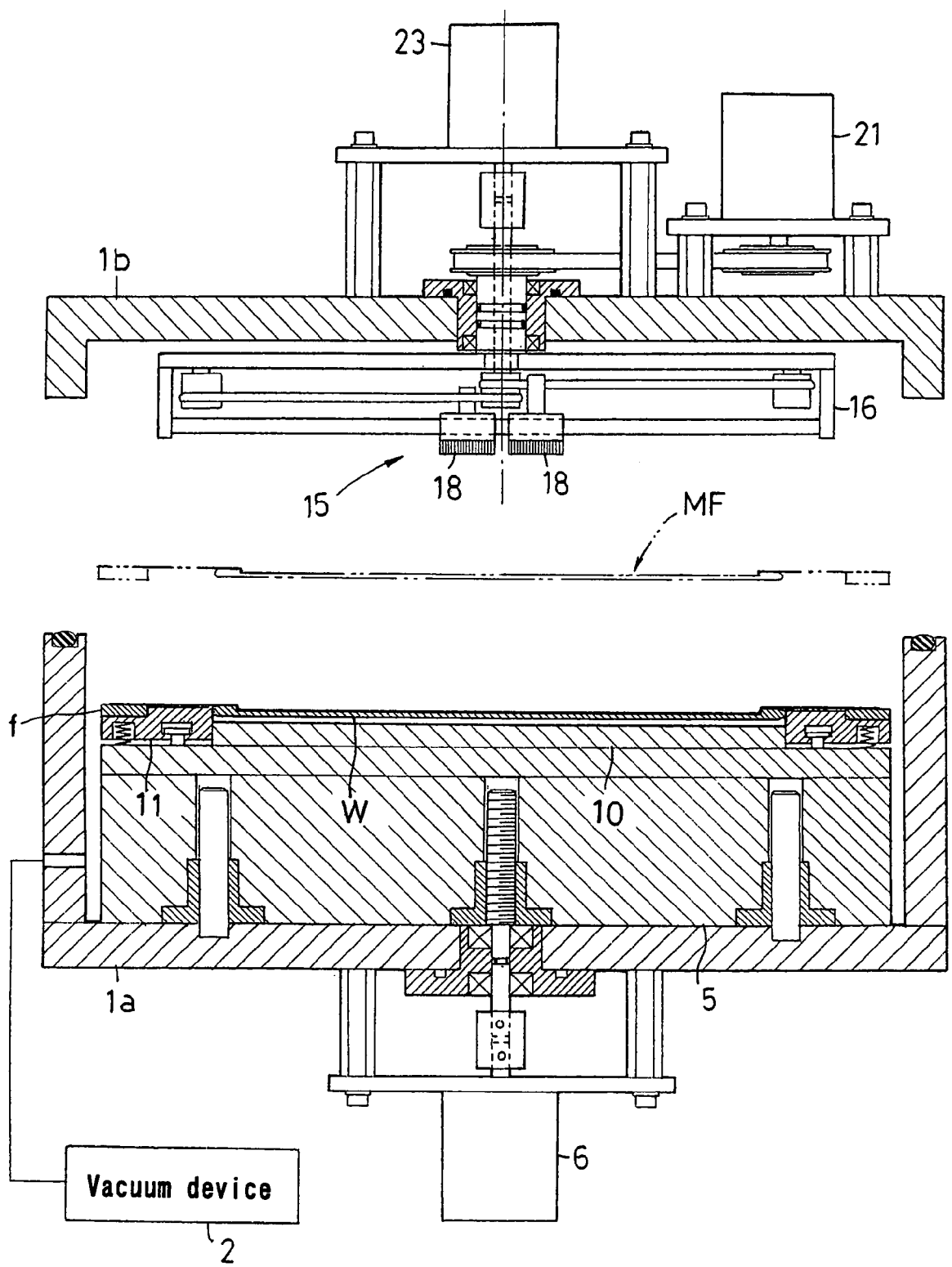
FIG. 5 is a vertical sectional view illustrating an operation of transporting a mount frame out of the semiconductor wafer mount apparatus according to the first embodiment.

(6) After completion of the joining operation, the movable table 5 moves downward to return to the initial position. Further, outside air is flown into the chamber 1; thus, the internal pressure in the chamber 1 returns to the atmospheric pressure. As illustrated in FIG. 5, thereafter, the lid case 1b moves upward, so that the wafer joining apparatus is open. Thus, a mount frame MF in which the wafer W is joined to and supported by the ring frame f is taken out of the wafer joining apparatus by transport means (not illustrated).

Thus, a series of the joining processes is completed and, thereafter, the aforementioned processes are performed repeatedly.

With the apparatus according to the aforementioned embodiment, the joining member 18 is pressed against the center of the non-adhesive surface of the adhesive tape DT joined to the ring frame f placed so as to be opposite to the flat concave portion b such that the adhesive surface of the adhesive tape DT is directed to the flat concave portion b. In this state, the joining member 18 is moved from the center in the outward direction while revolving. Thus, the adhesive tape DT can be joined to the flat concave portion b and the annular convex portion r of the wafer W with good accuracy.

Moreover, since the adhesive tape DT is joined to the wafer W under the reduced pressure in the chamber 1, air is prevented from getting in an interface between the adhesive tape DT and the wafer W. Further, if the pressure in the chamber 1 returns to the atmospheric pressure, part of the adhesive tape DT, which is not joined to the wafer W yet, is pressurized evenly, so that uneven joining is resolved.

FIGS. 8 to 12 illustrate a wafer joining apparatus and a wafer joining procedure according to a second embodiment.

The apparatus according to this embodiment is identical to the apparatus according to the first embodiment except a structure of a joining mechanism 15; therefore, identical members and portions are denoted by identical reference numerals, and specific description will be given of only the difference between the apparatus according to this embodiment and the apparatus according to the first embodiment.

In this embodiment, the joining mechanism 15 has a configuration that a pressing member 30 is fixedly attached to an interior of a lid case 1b. The pressing member 30 is formed into a disc shape which has a diameter slightly smaller than a diameter of a flat concave portion b formed by grinding on a back face of a wafer W. Moreover, the pressing member 30 protrudes downward from an inner surface of the lid case 1b by a predetermined length. That is, the pressing member 30 can be internally fitted to the flat concave portion b. In addition, the pressing member 30 includes a heater 31, and is attached to the lid case 1b through a heat insulator 32 for preventing propagation of heat to the lid case 1b.

Next, description will be given of operations performed by the wafer joining apparatus according to this embodiment.

Figure 8:
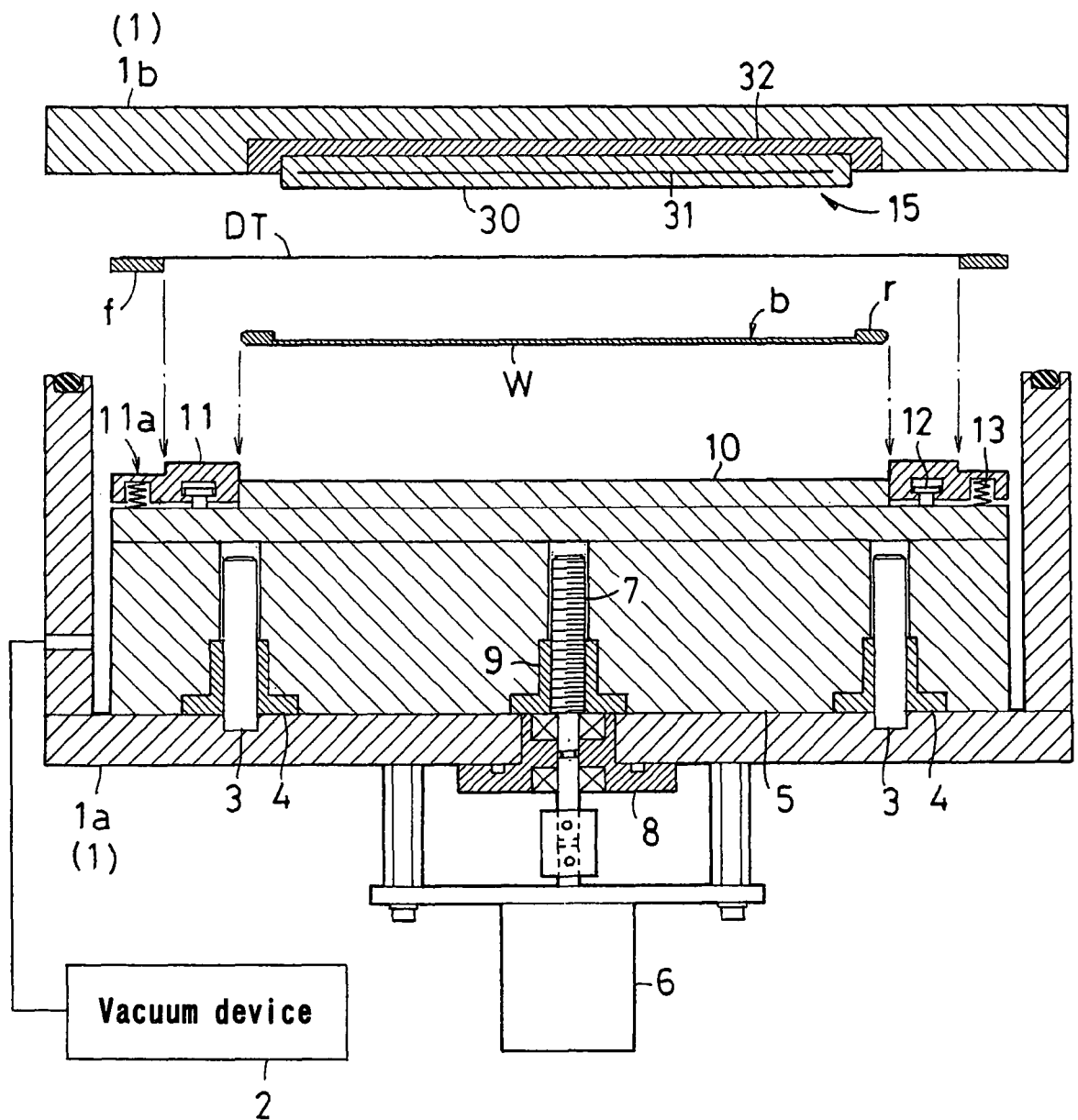
FIG. 8 is a vertical sectional view illustrating an operation of transporting a semiconductor wafer and a ring frame into a semiconductor wafer mount apparatus according to a second embodiment of the present invention.

(1) As illustrated in FIG. 8, a chamber 1 is open in such a manner that the lid case 1b is retracted upward. A wafer W is transported into the wafer joining apparatus in a state that a back face thereof, on which a flat concave portion b is formed by back grinding, is directed upward. Herein, a ring frame f is also transported into the wafer joining apparatus in a state that an adhesive surface of a supporting adhesive tape DT joined thereto is directed downward. Also herein, a movable table 5 is situated at its lower limit position.

(2) The wafer W transported into the wafer joining apparatus is placed on a wafer support bench 10, and then is positioned by an inner periphery of a ring frame support bench 11. The ring frame f transported into the wafer joining apparatus is positioned by and placed on a recessed stage 11a of the ring frame support bench 11.

Figure 9:
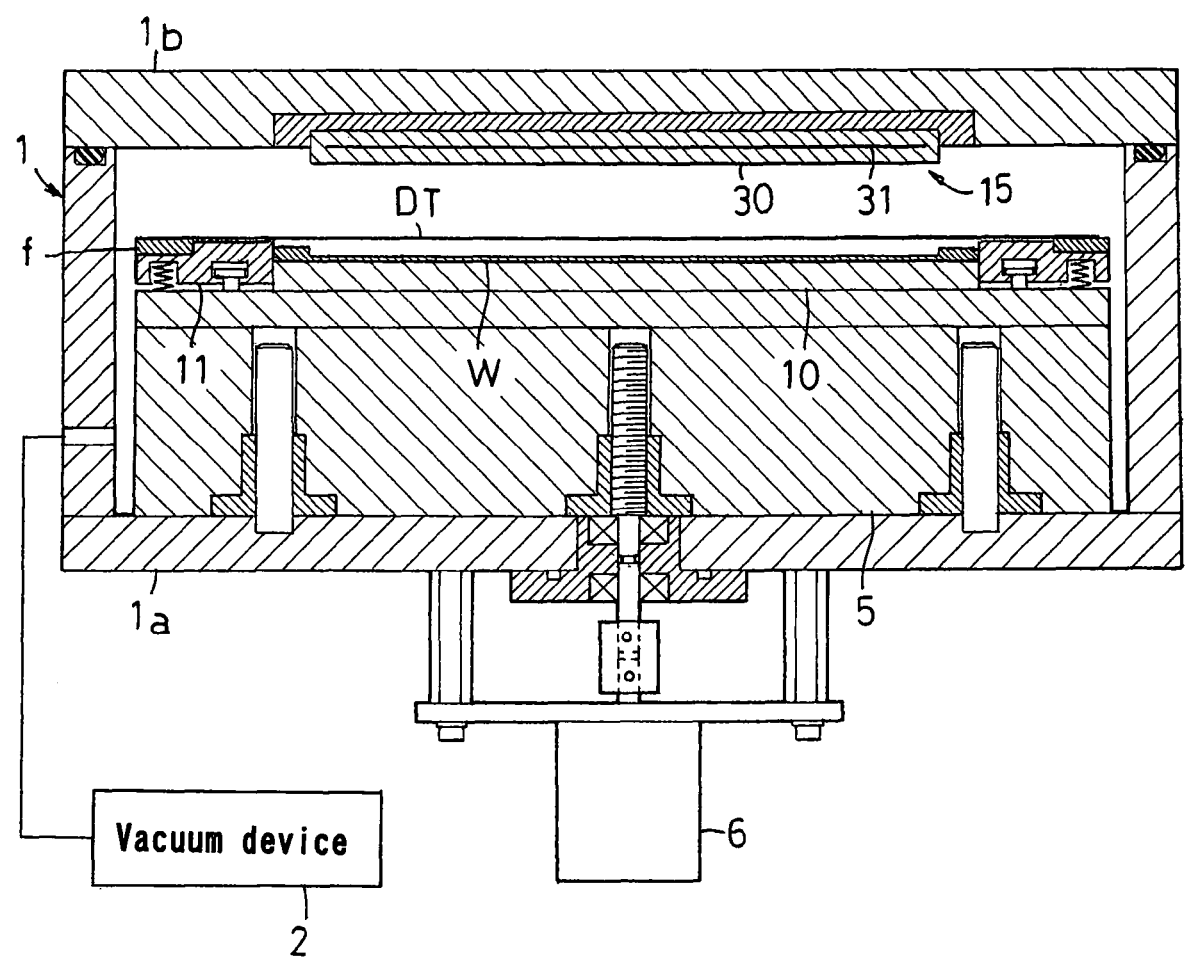
FIGS. 9 to 11 are vertical sectional views each illustrating an operation of joining the semiconductor wafer to the ring frame in the second embodiment.

(3) As illustrated in FIG. 9, when both the wafer W and the ring frame f are transported into the wafer joining apparatus, the lid case 1b moves downward. Thus, the lid case 1b is hermetically attached to an upper end of a chamber main body 1a. Thereafter, a vacuum device 2 sucks air in the chamber 1, so that a pressure in the chamber 1 is reduced.

Figure 10:
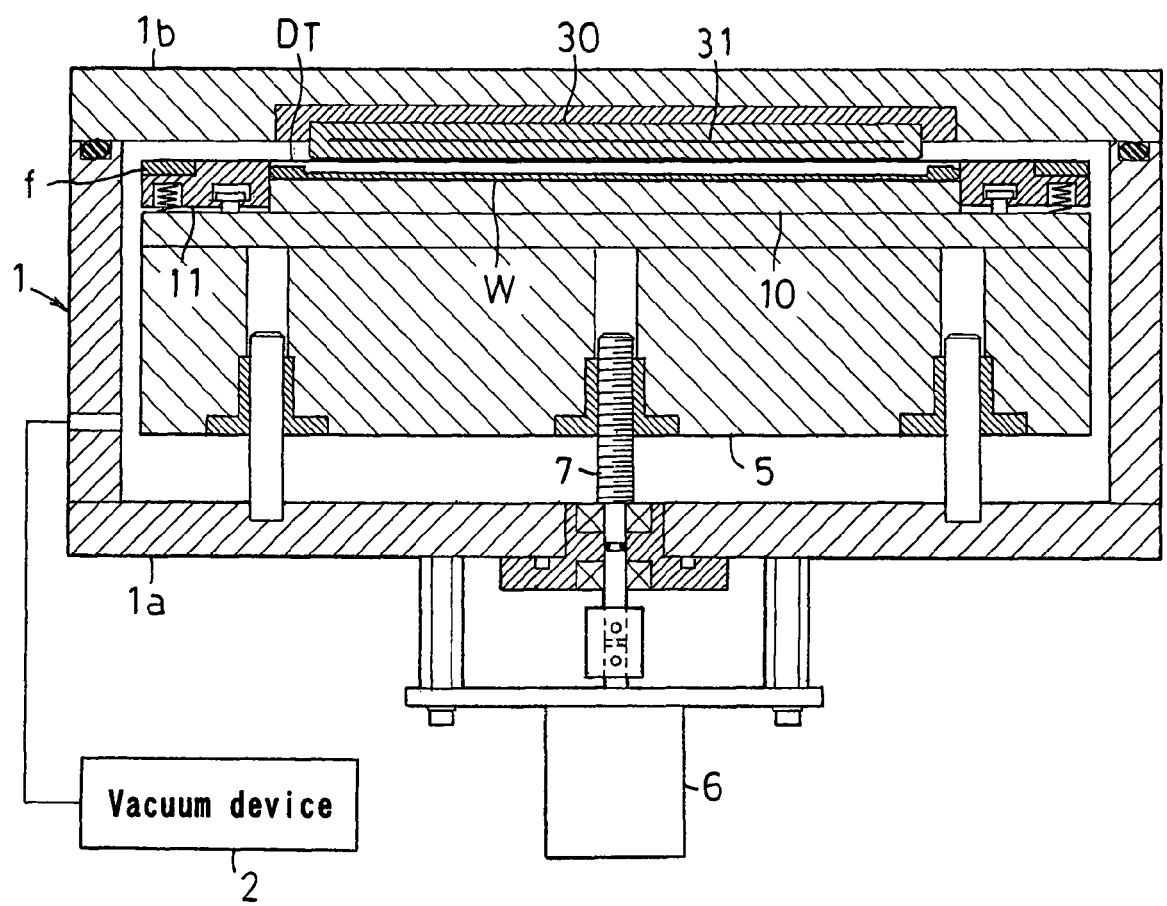

(4) As illustrated in FIG. 10, when the internal pressure in the chamber 1 is reduced to a predetermined pressure which is an almost vacuum state, the movable table 5 is driven to move upward, reaches a predetermined position, and stops at the predetermined position temporarily. Herein, the adhesive tape DT slightly comes into contact with a bottom surface of the pressing member 30 heated by the heater 31. Thus, the adhesive tape DT is heated and, therefore, is softened appropriately.

Figure 11:
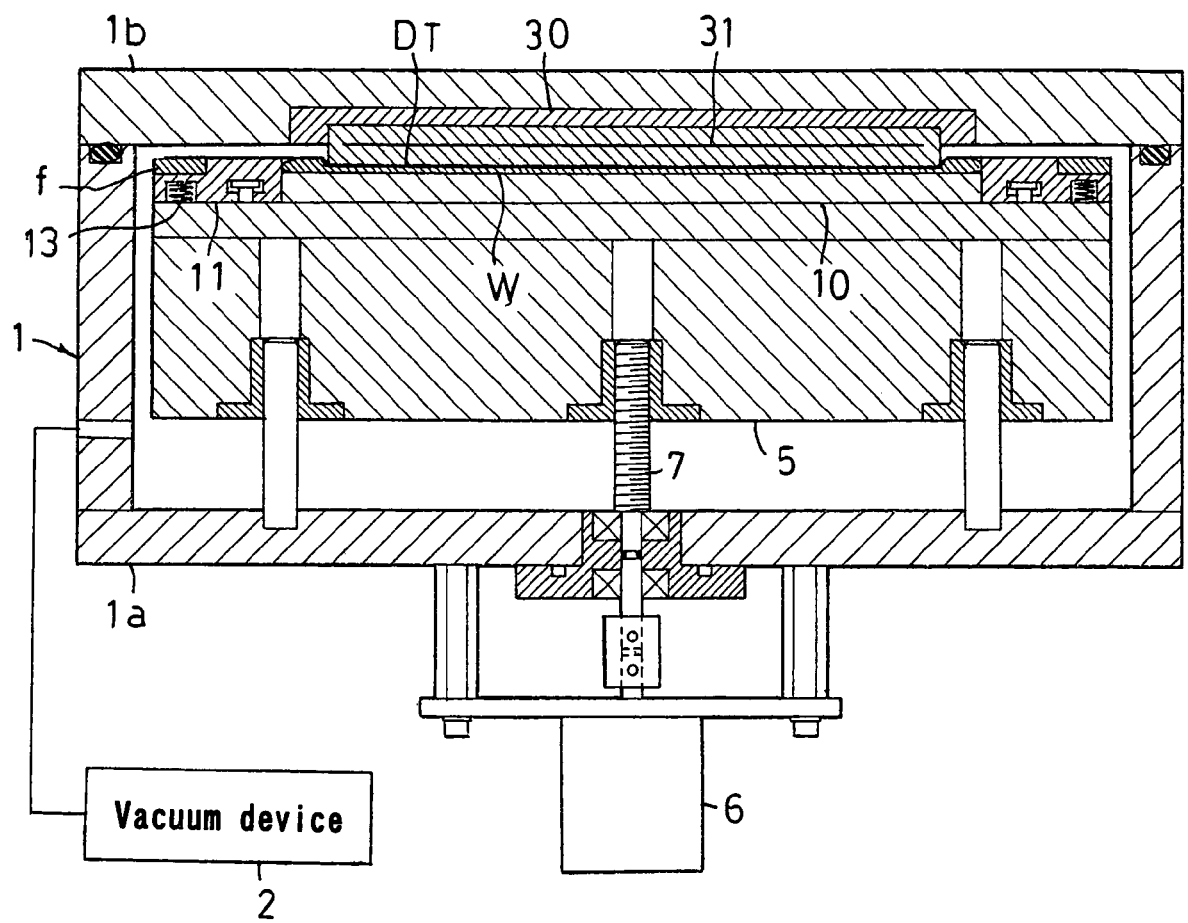

(5) As illustrated in FIG. 11, next, the movable table 5 slightly moves upward by a distance smaller than a predetermined distance. Then, the pressing member 30 is relatively pushed into the flat concave portion b of the wafer W. Thus, the softened adhesive tape DT is deformed, and then is pushed into and joined to the flat concave portion b.

Herein, the ring frame support bench 11 is pushed downward against a spring 13 to move to its lower limit level, and a top of the ring frame support bench 11 becomes flush with a top of an annular convex portion r, so that the adhesive tape DT is joined to the annular convex portion r with certainty.

Figure 12:
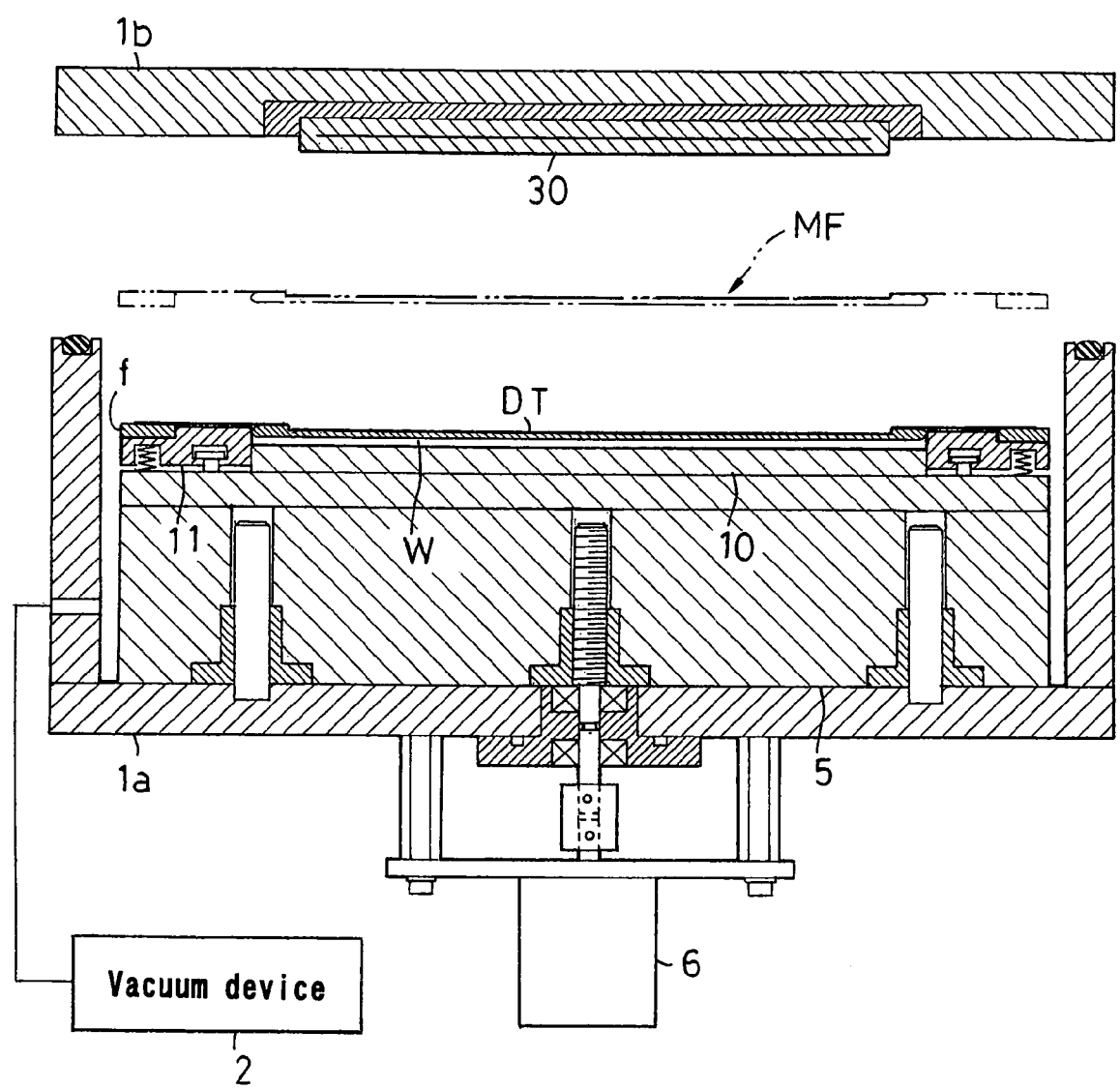
FIG. 12 is a vertical sectional view illustrating an operation of transporting a mount frame out of the semiconductor wafer mount apparatus according to the second embodiment.

(6) After completion of the joining operation, the movable table 5 moves downward to return to the initial position. Further, outside air is flown into the chamber 1; thus, the internal pressure in the chamber 1 returns to the atmospheric pressure. As illustrated in FIG. 12, thereafter, the lid case 1b moves upward, so that the wafer joining apparatus is open. Thus, a mount frame MF in which the wafer W is joined to and supported by the ring frame f is taken out of the wafer joining apparatus by appropriate transport means.

Thus, a series of the joining processes is completed and, thereafter, the aforementioned processes are performed repeatedly.

With the apparatus according to the aforementioned embodiment, the adhesive tape DT is heated by the heater 31, and then is softened appropriately. Thereafter, the adhesive tape DT is pushed into the flat concave portion b by the pressing member 30. Accordingly, the adhesive tape DT can be joined to the entire area of the flat concave portion b at a single stroke.

The present invention may be modified as follows.

(1) The shape of the joining member 18 in the first embodiment is not limited to the brush shape. Alternatively, the joining member 18 may be a rubber lancet, an elastic roller capable of idling, or the like.

Figure 7:
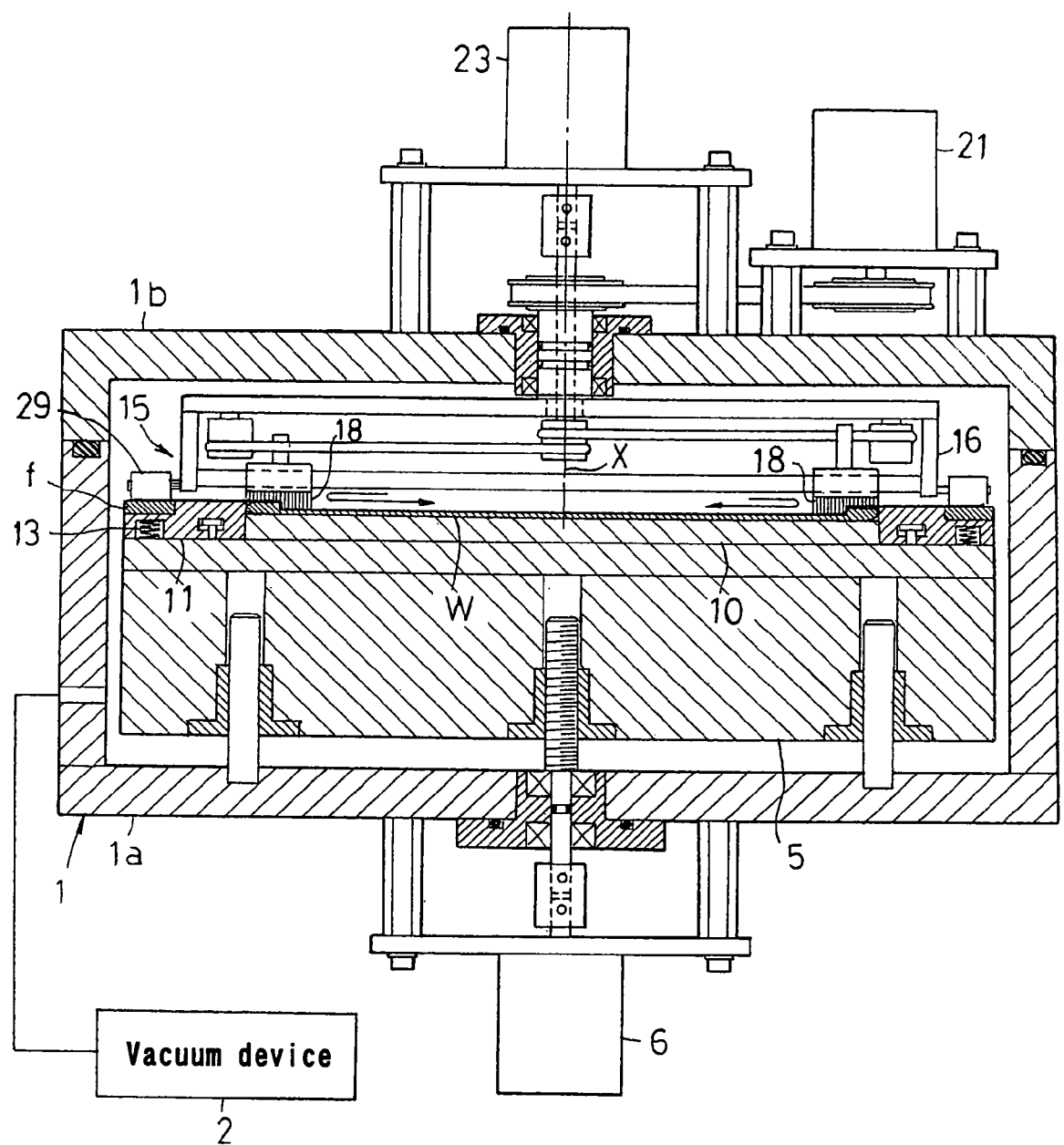
FIG. 7 is a vertical sectional view illustrating a modification of the semiconductor wafer mount apparatus according to the first embodiment.

(2) In the first embodiment, as illustrated in FIG. 7, a plurality of pressing members 29 are provided at an outer periphery of the rotation frame 16. Herein, each pressing member 29 is a rubber roller capable of idling. In the rotating/joining operation, the rotation frame 16 moves while the pressing member 29 presses the ring frame f, so that the ring frame f can be prevented from floating and vibrating. With this configuration, the wafer W can be joined to the ring frame f with higher accuracy.

(3) In the first embodiment, a vacuum suction hole is formed in the recessed stage 11a of the ring frame support bench 11. The ring frame f placed on the ring frame support bench 11 is secured by sucking. In the rotating/joining operation, as a result, the ring frame f can be prevented from being rotated together with the joining member 18 and can be prevented from slightly moving.

(4) In each of the foregoing embodiments, the ring frame support bench 11 moves downward such that the top of the ring frame support bench 11 becomes flush with the top of the annular convex portion r, so that the adhesive surface of the adhesive tape DT comes into contact with the top of the ring frame support bench 11. The top of the ring frame bench 11 is made to an adhesion-retarded surface, preferably a non-adhesive surface. With this configuration, the mount frame MF becomes less susceptible to join to the top of the ring frame support bench 11. Thus, the mount frame MF can be readily transported out of the wafer joining apparatus.

(5) In each of the foregoing embodiments, the wafer joining apparatus may be turned upside down.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for joining a semiconductor wafer to a ring frame through a supporting adhesive tape such that the ring frame holds the semiconductor wafer, the apparatus comprising:
   a wafer support bench supporting a flat back face of a semiconductor wafer on which an annular convex portion is formed along an outer periphery so as to surround a back-ground area and a flat concave portion is formed at an inner-diameter side of the annular convex portion;
   a ring frame support bench holding a ring frame having an adhesive tape joined thereto;
   and
   a joining mechanism joining the adhesive tape to the flat concave portion of the semiconductor wafer while pressing the adhesive tape against the flat concave portion of the semiconductor wafer
   wherein the joining mechanism includes:
   a rotation frame rotating about a vertical axis center concentric with a center of the wafer support bench;
   a guide shaft horizontally provided on a lower side of the rotation frame; and
   a pair of joining members each guided and supported by the guide shaft so as to move horizontally, and
   wherein the joining member moves spirally while revolving in synchronization with the rotation of the rotation frame.

2. The apparatus of claim 1, wherein
the joining member is formed into an elastically deformable brush shape.

3. The apparatus of claim 1, further comprising:
a pressing member pressing the ring frame when the joining member moves spirally while revolving.

4. The apparatus of claim 3, wherein
the pressing member includes a plurality of rollers pressing the ring frame at a plurality of points and rolling on the ring frame in synchronization with the revolving and moving of the joining member.

5. The apparatus of claim 1, further comprising:
a chamber including the wafer support bench, the ring frame support bench and the joining mechanism; and
a vacuum device reducing a pressure in the chamber.

6. The apparatus of claim 1, wherein
the ring frame supported on the ring frame support bench is suction held.

* * * * *